United States Patent
Park et al.

(10) Patent No.: US 7,310,280 B2
(45) Date of Patent: Dec. 18, 2007

(54) FLASH MEMORY DEVICE

(75) Inventors: Hee Sik Park, Chungcheongbuk-do (KR); Kyeong Bock Lee, Kyeongki-do (KR); Byung Soo Park, Kyeongki-do (KR)

(73) Assignee: Hynix Semiconductor Inc, Icheon-Si (KR)

( * ) Notice: Subject to any disclaimer, the term of this patent is extended or adjusted under 35 U.S.C. 154(b) by 0 days.

(21) Appl. No.: 11/299,063

(22) Filed: Dec. 9, 2005

(65) Prior Publication Data

US 2006/0139997 A1 Jun. 29, 2006

(30) Foreign Application Priority Data

Dec. 27, 2004 (KR) .................. 10-2004-0112829
May 3, 2005 (KR) .................. 10-2005-0037101

(51) Int. Cl.
*G11C 7/02* (2006.01)
(52) U.S. Cl. .................. 365/210; 365/185.17
(58) Field of Classification Search ................ 365/210, 365/185.17, 185.256
See application file for complete search history.

(56) References Cited

U.S. PATENT DOCUMENTS

| 5,524,094 A | * | 6/1996 | Nobukata et al. ...... 365/185.21 |
| 7,079,437 B2 | * | 7/2006 | Hazama et al. ............. 365/210 |
| 2004/0169206 A1 | | 9/2004 | Kim et al. |

FOREIGN PATENT DOCUMENTS

| JP | 2000-111573 A | 4/2000 |
| JP | 2001-006377 A | 1/2001 |
| JP | 2001-006377 | 12/2001 |
| JP | 2004-127346 | 4/2004 |
| KR | 10-2000-0042829 A | 7/2000 |

* cited by examiner

*Primary Examiner*—Vu A. Le
(74) *Attorney, Agent, or Firm*—Townsend & Townsend & Crew LLP

(57) ABSTRACT

A flash memory device comprises a first group of dummy memory cells disposed between source selection transistors, which are coupled to a source selection line, and memory cells coupled to a first wordline. The flash memory device further comprises a second group of dummy memory cells disposed between drain selection transistors, which are coupled to a drain selection line, and memory cells coupled to the last wordline. The flash memory device is configured to prevent program disturbance in deselected cell strings and degradation of programming/erasing speeds in a selected cell string.

23 Claims, 17 Drawing Sheets

| LINE | PROGRAMMING | READING | ERASING |
|---|---|---|---|
| DWL | Vpass | Vread | 0V |
| SELECTED WL | Vpgm | 0V | 0V |
| DESELECTED WL | Vpass | Vread | 0V |
| DSL | VCC | Vread | Floating |
| SSL | 0V | Vread | Floating |
| CSL | VCC | 0V | Floating |
| SELECTED BL | 0V | 1V | Floating |
| DESELECTED BL | VCC | 0V | Floating |
| BULK | 0V | 0V | 20V |

| LINE | PROGRAMMING | READING | ERASING |
|---|---|---|---|
| DWL | Vpass or Vpass2 | Vread | 0V |
| SELECTED WL | Vpgm | 0V | 0V |
| DESELECTED WL | Vpass | Vread | 0V |
| DSL | VCC | Vread | Floating |
| SSL | 0V | Vread | Floating |
| CSL | VCC | 0V | Floating |
| SELECTED BL | 0V | 1V | Floating |
| DESELECTED BL | VCC | 0V | Floating |
| BULK | 0V | 0V | 20V |

| LINE | PROGRAMMING | READING | ERASING |
|---|---|---|---|
| DWL | VCC | VCC | Floating |
| SELECTED WL | Vpgm | 0V | 0V |
| DESELECTED WL | Vpass | Vread | 0V |
| DSL | VCC | Vread | Floating |
| SSL | 0V | Vread | Floating |
| CSL | VCC | 0V | Floating |
| SELECTED BL | 0V | 1V | Floating |
| DESELECTED BL | VCC | 0V | Floating |
| BULK | 0V | 0V | 20V |

| LINE | PROGRAMMING | READING | ERASING |
|---|---|---|---|
| DWL | Vpass | Vread | 0V |
| SELECTED WL | Vpgm | 0V | 0V |
| DESELECTED WL | Vpass | Vread | 0V |
| DSL | VCC | Vread | Floating |
| SSL | 0V | Vread | Floating |
| CSL | VCC | 0V | Floating |
| SELECTED BL | 0V | 1V | Floating |
| DESELECTED BL | VCC | 0V | Floating |
| BULK | 0V | 0V | 20V |

FLASH MEMORY DEVICE

BACKGROUND

1. Field of the Invention

The present invention relates to flash memory devices and more particularly, to a NAND-type flash memory device configured to prevent programming disturbance at memory cells adjacent to drain and source selection transistors and to improve programming speeds for memory cells.

2. Discussion of Related Art

Flash memories, which are known as types of nonvolatile memory devices capable of retaining data even when power is interrupted therein, are referred to as devices operable without refresh functions. In flash memories, "programming" refers to an operation for writing data in memory cells. "Erasing" refers to an operation for eliminating data from memory cells. Such flash memories are roughly classified into NOR and NAND types in accordance with the cell structures and operational conditions. A NOR-type flash memory, in which the sources of memory cell transistors are coupled to a ground voltage, can program erase data for memory cells with random addresses, and can be used in applications necessary for high operation speed. A NAND-type flash memory is configured with pluralities of memory cell transistors coupled in series to form a cell string that is connected between a drain selection transistor and a source selection transistor, which can be used for high-density data storage.

FIG. 1 shows a conventional NAND-type flash memory device.

Referring to FIG. 1, the number of memory cells MC0~MC31 are coupled in series between a drain selection transistor DST and a source selection transistor SST. Typical designs involve 16, 32, or 64 memory cells in consideration with the device topology and density.

In FIG. 1, there are pluralities of cell strings each of which is composed of 32 memory cells. Memory cells (e.g., MC0) controlled by a single wordline (e.g., WL0) form one page that is a group of memory cells. FIG. 1 exemplarily shows 32 pages.

However, the NAND-type flash memory device as shown in FIG. 1 is vulnerable to program disturbances arising from memory cells MC0, which are coupled to the first wordline WL0 adjacent to the source selection line SSL and a deselected bitline (e.g., BL0), and program disturbances from memory cells MC31 coupled to the last wordline adjacent to the drain selection line DSL and the deselected bitline BL0. These program disturbances occur because channels of the source selection transistor SST, the drain selection transistor DST, and the memory cells MC0~MC31 are boosted up to 0V, 1V, and about 8V, respectively, when a ground voltage 0V, a power source voltage VCC, and a program inhibit voltage Vpass are applied to the source selection line SSL, the drain selection line DSL, and the rest wordlines WL1~WL31, respectively.

In more detail, a lateral electric field is strongly formed between the source selection transistor SST and the memory cell MC0 due to the difference of channel voltages between source selection transistor SST and memory cell MC0, i.e., between 0V and 8V. A lateral electric field is also formed between the drain selection transistor DST and the memory cell MC31 due to the difference of channel voltages between drain selection transistor DST and memory cell MC31, i.e., between 1V and 8V. If such voltage differences causes the strong electric fields laterally, electrons generated at borders between a gate oxide film of the source selection transistor SST and a silicon substrate Si-Sub move toward the memory cell MC0 along the surface of the silicon substrate Si-Sub, resulting in hot electrons. Those hot electrons generated move in a lateral direction and flow into floating gates of the memory cells MC0 and MC31, programming the memory cells MC0 and MC31.

Meanwhile, programming speeds for the memory cells MC0 and MC31 coupled to a selected bitline BL1 and the first and last wordlines WL0 and WL31 are slower than those for other memory cells MC1~MC30. The reason for the slower programming speeds is because threshold voltages Vt of the memory cells MC0 and MC31 coupled to the first and last wordlines WL0 and WL31 and the selected bitline BL1 are lower than threshold voltages of the memory cells MC1~MC30 coupled to the rest of wordlines WL1~WL30 so that there are voltage differences between the source selection line SSL and the first wordline WL0 and between the drain selection line DSL and the last wordline WL31.

In other words, the memory cells MC0 and MC31 are influenced by electric potentials of the source selection transistor SST and the drain selection transistor DST, so that the threshold voltages of the memory cells MC0 and MC31 become lower than those of the other memory cells MC1~MC30. As a result, the memory cells MC0 and MC31 have slower programming speeds than that of the other memory cells MC1~MC30.

FIG. 2 is a graphic diagram showing a wordline with program disturbance by hot electrons in the NAND-type flash memory device of FIG. 1, illustrating the relation between the memory cell MC0, MC31, and the program inhibit voltage Vpass.

As shown in FIG. 2, the memory cells MC0 and MC31 coupled to the first and last wordlines WL0 and WL31, respectively, have different threshold voltages Vt than that of the other memory cells MC1~MC30 respectively coupled to the rest wordlines WL1~WL30. This arises from the program disturbance by the hot electrons as aforementioned.

FIG. 3 is a graphic diagram showing distribution profiles of threshold voltages Vt of the memory cells MC0~MC31 while performing a program operation with the same voltage to the wordlines WL0~WL31 of the memory cells MC0~MC31 coupled to the selected bitline BL1. Here, the lower threshold voltages result in slower programming speeds.

As shown in FIG. 3, it can be seen that the programming speed becomes slower due to the lower threshold voltages of the memory cells MC0 and MC31 coupled to the first and last wordlines WL0 and WL31, respectively, in comparison with those of the other memory cells WL1~WL30.

The effect of program disturbance as shown in FIG. 2 and the degradation of programming speed as shown in FIG. 3 becomes more serious as a memory cell becomes smaller in size. And, a multi-level cell is more vulnerable against the aforementioned troubles than a single-level cell. As a result, such program disturbance and degradation of programming speed may deteriorate the performance of the NAND-type flash memory device.

SUMMARY OF THE INVENTION

The present invention is directed to a flash memory device configured to prevent an effect of program disturbance at memory cells adjacent to drain and source selection transistors in a deselected cell string.

The present invention is also directed to a flash memory device configured to prevent programming speeds from being degraded at memory cells adjacent to drain and source selection transistors in a selected cell string.

An aspect the present invention is to provide a flash memory device comprising: first selection transistors each coupled to pluralities of bitlines; second selection transistors coupled to a common source line; and pluralities of memory cells coupled each between the first and second selection transistors and coupled each to the plural wordlines. The plural memory cells include dummy memory cells coupled between memory cells connected to a first wordline and the second selection transistors, the dummy memory cells being without a programming operation.

In this embodiment, memory cells coupled to the first wordline and a deselected bitline of the plural bitlines are free from an effect of program disturbance by the dummy memory cell.

In this embodiment, the dummy memory cells are substituted with dummy transistors.

In this embodiment, a dummy wordline coupled to the dummy transistors is supplied with a power source voltage in programming and read operations, and supplied with a ground voltage in an erase operation.

In this embodiment, a dummy wordline coupled to the dummy memory cells is supplied with a voltage higher than a double power source voltage and lower than a program inhibit voltage applied to the plural wordlines.

In this embodiment, a dummy wordline coupled to the dummy memory cells is supplied with a program inhibit voltage applied to the plural wordlines in a program operation.

In this embodiment, a dummy wordline coupled to the dummy memory cells is supplied with a ground voltage in an erase operation and supplied with a read voltage applied to the plural wordlines in a read operation.

In this embodiment, the dummy memory cells are formed in the same size with memory cells to be programmed.

In this embodiment, memory cells except for dummy memory cells of first and second groups among the plural memory cells are multi-level cells.

In another aspect of the present invention, a flash memory device comprises: first selection transistors each coupled to pluralities of bitlines; second selection transistors coupled to a common source line; and pluralities of memory cells coupled each between the first and second selection transistors and coupled each to the plural wordlines. The plural memory cells include dummy memory cells coupled between memory cells connected to a last wordline and the first selection transistors, the dummy memory cells being without a program operation.

In this embodiment, threshold voltages of memory cells coupled to the last wordline and a selected bitline of the plural bitlines are equal to threshold voltages of the other memory cells by the dummy memory cell.

Another aspect of the present invention, a flash memory device comprises: first selection transistors each coupled to pluralities of bitlines; second selection transistors coupled to a common source line; and pluralities of memory cells coupled each between the first and second selection transistors and coupled each to the plural wordlines. The plural memory cells include dummy memory cells of a first group coupled between memory cells connected to a first wordline and the second selection transistors, the dummy memory cells of the first group being without a program operation, and the plural memory cells include dummy memory cells of a second group coupled between memory cells connected to a last wordline and the first selection transistors, the dummy memory cells of the second group being without a program operation.

In this embodiment, memory cells coupled to the first and second wordlines, and a deselected bitline of the plural bitlines are free from an effect of program disturbance by the dummy memory cells of the first and second groups.

In this embodiment, the dummy memory cells of the first group are substituted with dummy transistors of a first group and the dummy memory cells of the second group are substituted with dummy transistors of a second group.

In this embodiment, a first dummy wordline coupled to the dummy transistors of the first group and a second dummy wordline coupled to the dummy transistors of the second group are supplied with a power source voltage in programming and read operations, and supplied with a ground voltage in an erase operation.

In this embodiment, a first dummy wordline coupled to the dummy transistors of the first group and a second dummy wordline coupled to the dummy transistors of the second group are supplied with a voltage higher than a double power source voltage and lower than a program inhibit voltage applied to the plural wordlines during a program operation.

In this embodiment, a first dummy wordline coupled to the dummy transistors of the first group and a second dummy wordline coupled to the dummy transistors of the second group are supplied with a program inhibit voltage applied to the plural wordlines in a program operation.

In this embodiment, a first dummy wordline coupled to the dummy transistors of the first group and a second dummy wordline coupled to the dummy transistors of the second group are supplied with a ground voltage in an erase operation and supplied with a read voltage applied to the plural wordlines in a read operation.

In this embodiment, the dummy memory cells of the first and second groups are formed in the same size with memory cells to be programmed.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
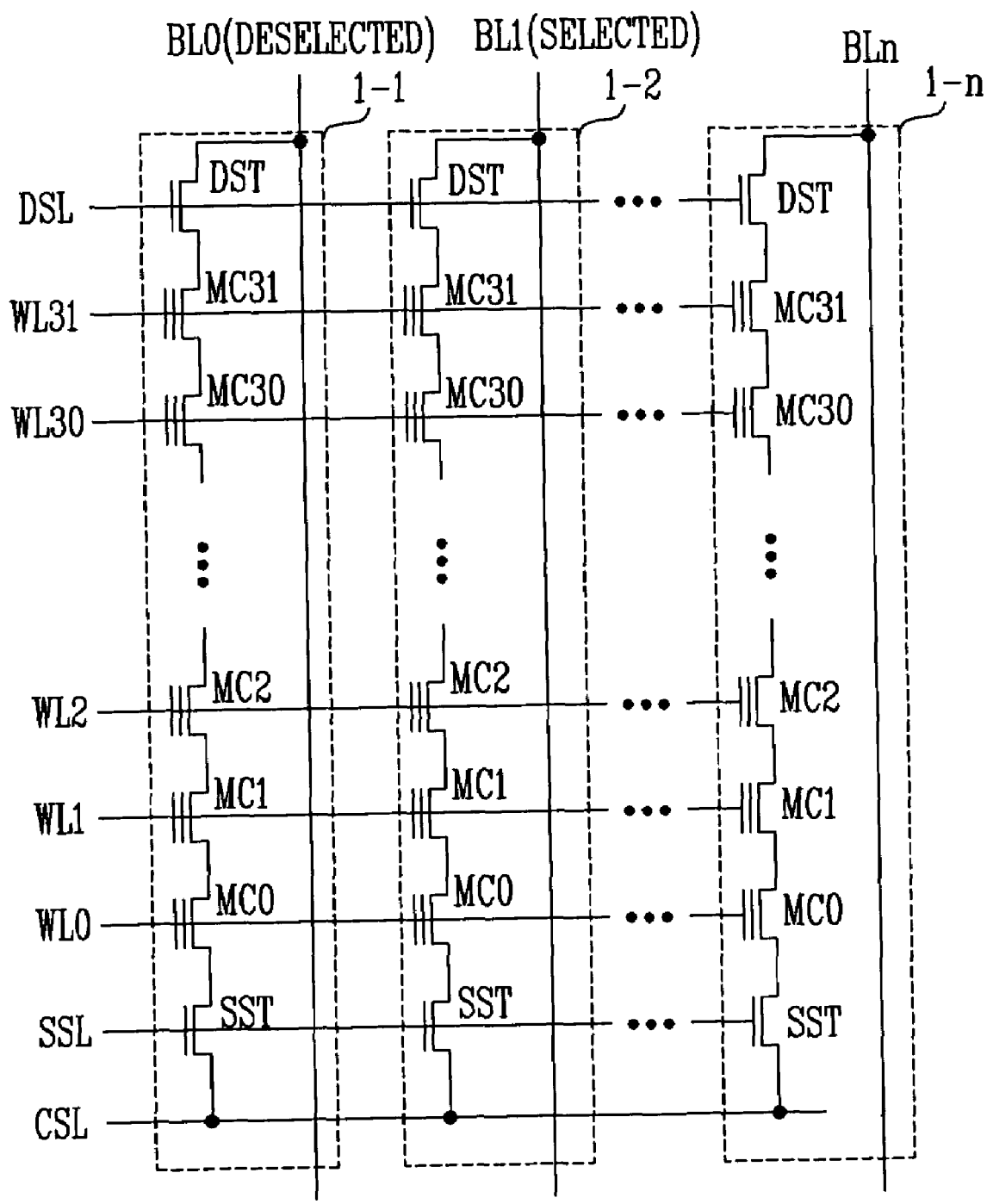
FIG. 1 is a diagram showing a conventional NAND-type flash memory device.
Figure 2:
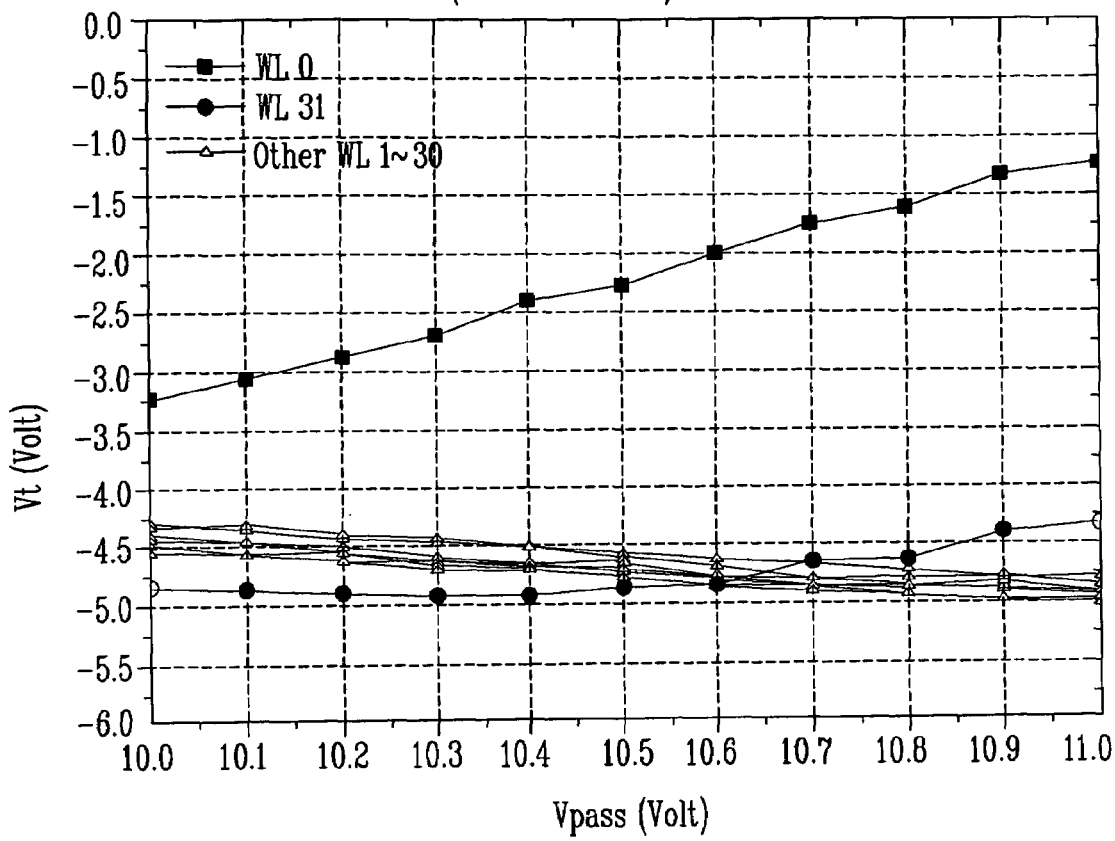
FIG. 2 is a graphic diagram showing a wordline where program disturbance occurs in the NAND-type flash memory device of FIG. 1.
Figure 3:
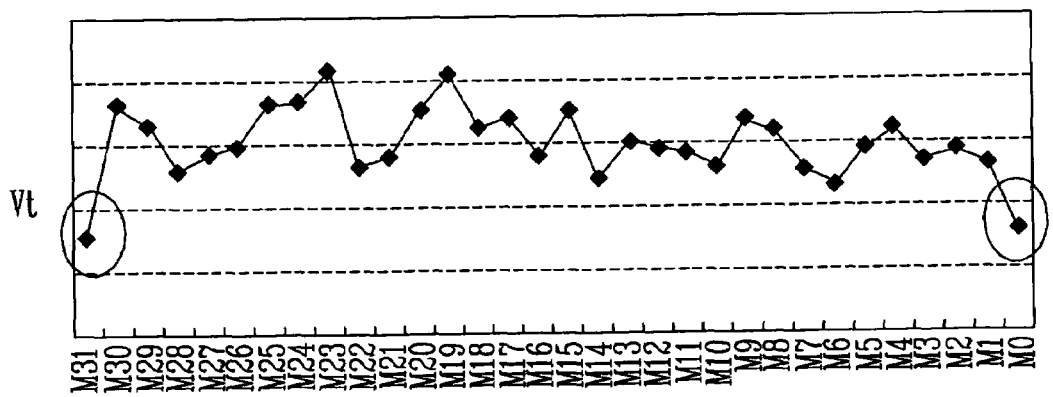
FIG. 3 is a graphic diagram showing a wordline with slower programming speeds in the NAND-type flash memory device.
Figure 4A:
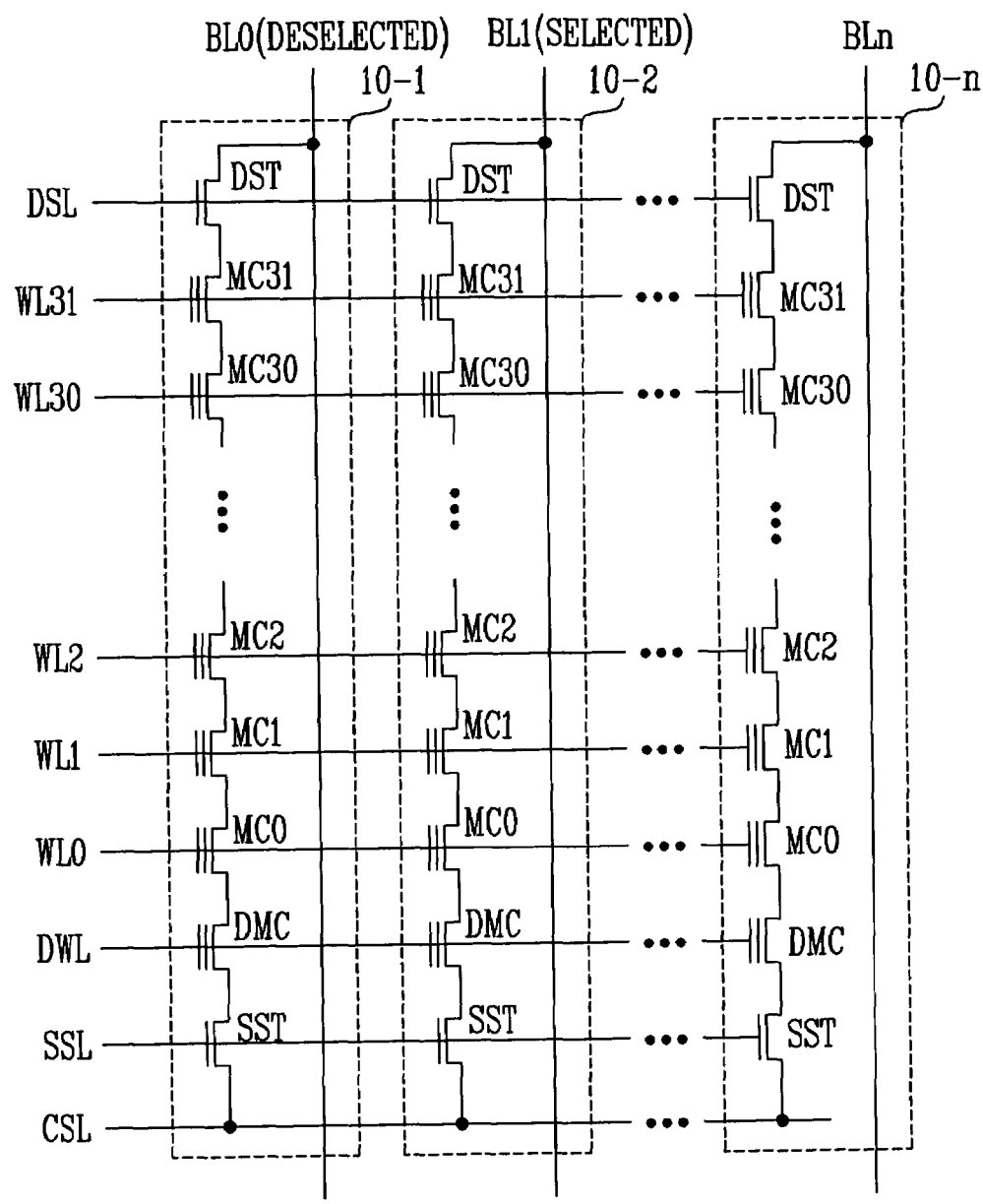
FIG. 4A is a diagram illustrating a NAND-type flash memory device in accordance with one embodiment of the present invention.

FIG. 4A illustrates a memory block of a NAND-type flash memory device in accordance with one embodiment of the present invention, providing a structure to prevent an effect of program disturbance at memory cells connected to first wordlines.

Referring to FIG. 4A, the NAND-type flash memory device includes pluralities of cell strings 10-1~10-n in number of n (n is a positive integer), each cell string including 32 memory cells. The memory cells (e.g., MC0) controlled by a wordline (e.g., WL0) form a unit page, i.e., a group of memory cells. Each of the cell strings 10-0~10-n includes a source selection transistor SST coupled to a common source line CSL, a drain selection transistor DST coupled to each of bitlines BL0~BLn, a dummy memory cell DMC, and memory cells MC0~MC31 coupled between the source selection transistor SST and the drain selection transistor DST. Here, the dummy memory cell DMC is coupled between the source selection transistor and the memory cell MC0. A gate of the drain selection transistor DST is coupled to a drain selection line DSL and a gate of the source selection transistor SST is coupled to a source selection line SSL. Control gates of the memory cells MC0~MC31 are coupled to first through 31st wordlines WL0~WL31 and a gate of the dummy memory cell DMC is coupled to a dummy wordline DWL. The dummy memory cells DMC are provided to prevent the program disturbance at the memory cells MC0 coupled to the first wordline WL0 in a deselected cell string (e.g., 10-1).

While the total number in one bitline of the dummy memory cells DMC and the memory cells MC0~MC31, which are coupled between the source selection transistor SST and the drain selection transistor DST in series, is 33 as shown in FIG. 4A, it should be appreciated that the number of memory cells can vary.

Figures 4B, 4C:
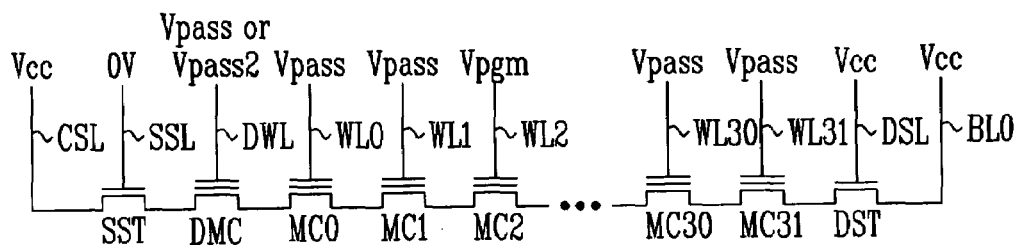
FIG. 4B is a diagram illustrating a structure of a deselected cell string shown in FIG. 4A.
FIG. 4C is a table chart showing conditions of programming, reading, and erasing voltages in FIG. 4A.

FIG. 4B shows a voltage applied to each line of the deselected cell string 10-1 in a program operation.

As illustrated in FIG. 4B, the deselected cell string 10-1 is supplied with a power source voltage VCC through the deselected bitline BL0 in order to prevent the memory cells MC0~MC31 thereof from being programmed during the program operation. In the program operation, a program voltage is applied to a wordline (e.g., WL2) coupled to a memory cell to be programmed, while a program inhibit voltage Vpass is applied to the rest wordlines (e.g., WL0, WL1, and WL3~WL31). The dummy wordline DWL is supplied with the program inhibit voltage Vpass. In alternative embodiments, the dummy wordline DWL is supplied with another program inhibit voltage Vpass2 higher than twice the voltage of VCC but lower than Vpass. The source selection line SSL is supplied with a ground voltage 0V, the drain selection line DSL is supplied with the power source voltage VCC, and the common source line CSL is supplied with the power source voltage VCC.

FIG. 4C shows conditions of programming, reading, and erasing voltages applied to the lines in FIG. 4A.

Referring to FIG. 4C, during the program operation, the dummy wordline DWL is supplied with the program inhibit voltage Vpass or the program inhibit voltage Vpass2. In the read operation, the dummy wordline DWL is supplied with a read voltage Vread that is applied to the deselected wordline. In the erase operation, the dummy wordline DWL is supplied with the ground voltage 0V.

Hereinafter, the mechanism of preventing the program disturbance at the memory cells MC0 by the dummy memory cells DMC in the deselected cell string 20-1 shown in FIG. 4C will be described, with reference to FIG. 4D.

Figure 4D:
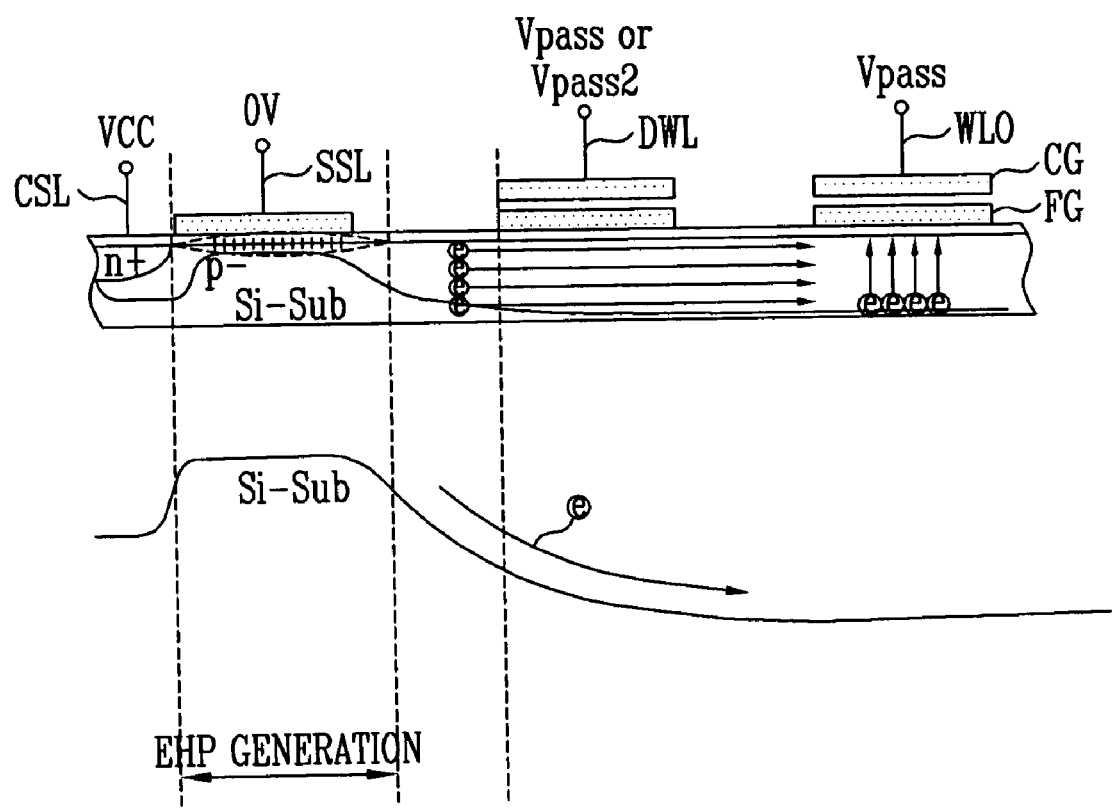
FIG. 4D is a diagram illustrating a moving direction in the deselected cell string of FIG. 4A.

Referring to FIG. 4D, a leakage current occurs by generation of electron-hole pairs (EHP) at the boundary surface between a gate oxide film and a silicon substrate Si-Sub in the source selection transistor SST. The holes generated therefrom flow into the silicon substrate Si-Sub while the electrons move toward the memory cell MC0 along the surface of the silicon substrate Si-Sub. During this, the electrons migrate to the memory cell MC0, passing through the dummy memory cell DMC of dummy word line DWL. The dummy memory cell DMC functions to transfer the electrons, which are not programmed by the program operation. As illustrated in FIG. 4D, the dummy memory cell DMC contributes to lengthen migration ranges of the electrons toward the memory cell MC0. Thus, while the electrons are being transferred toward the memory cell MC0, the energy of the electrons becomes weaker reducing the likelihood of these electrons becoming hot electrons. The electrons with the weaker energy cannot flow into the floating gate FG of the memory cell MC0 although they are scattering around the memory cell MC0, because the energy of the electrons do not have enough energy to move lengthwise. As a result, there is no program disturbance at the memory cell MC0.

Next, the case of disposing a dummy transistor on the dummy wordline instead of the dummy memory cell will be described, with reference to FIGS. 5A and 5C.

Figure 5A:
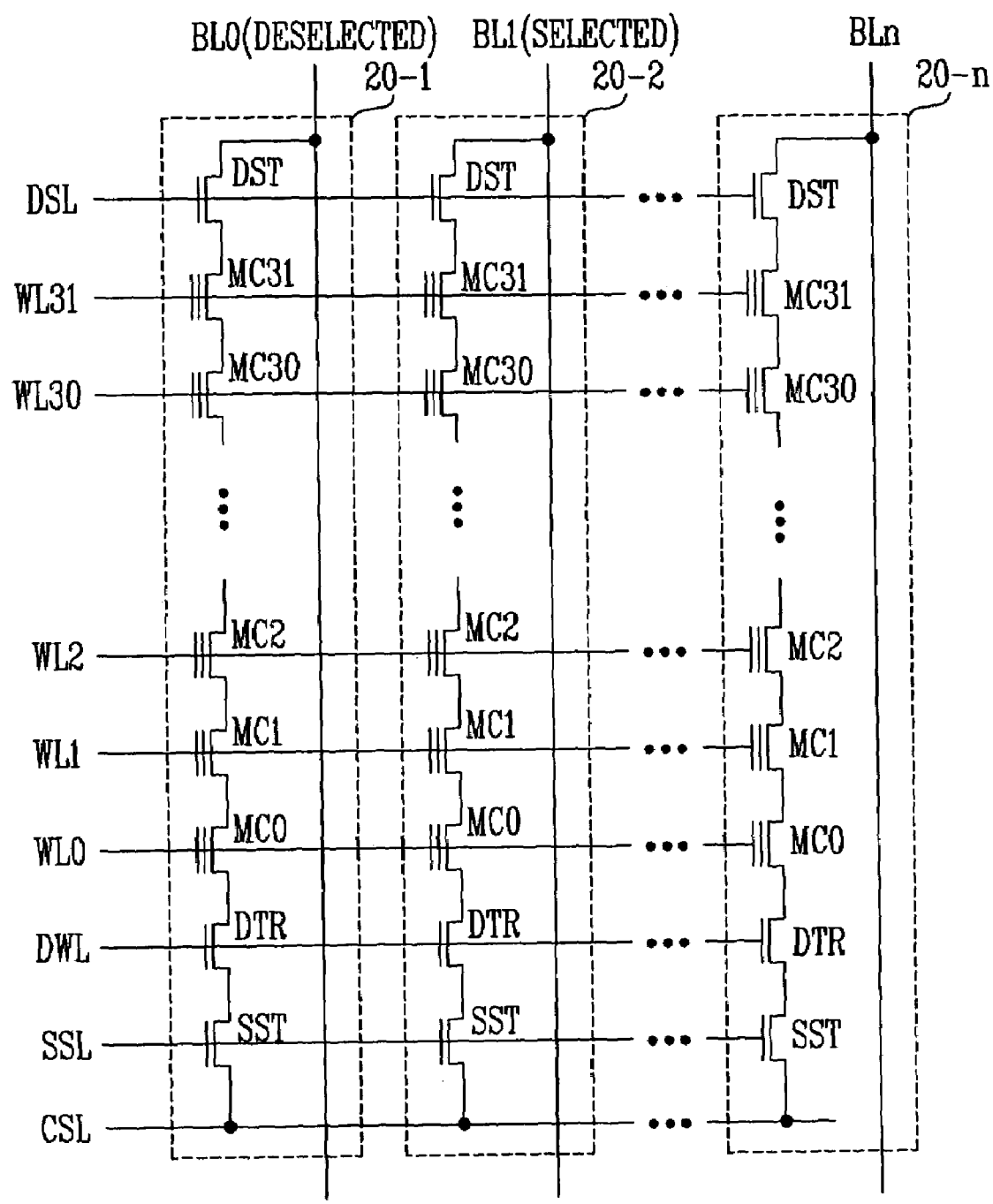
FIG. 5A is a diagram illustrating a NAND-type flash memory device in accordance with another embodiment of the present invention.

FIG. 5A is a diagram illustrating a NAND-type flash memory device in accordance with another embodiment of the present invention, being configured to prevent the program disturbance of the memory cells coupled to the first wordline WL0. The feature of FIG. 5A is different from FIG. 4A in that the dummy wordline DWL includes a dummy transistor DTR instead of the dummy memory cell DMC. In one embodiment, DTR may be larger or smaller than DMC.

Figures 5B, 5C:
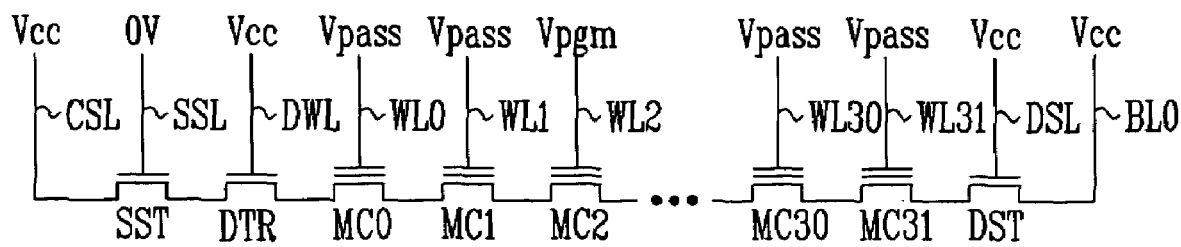
FIG. 5B is a diagram illustrating a structure of a deselected cell string shown in FIG. 5A.
FIG. 5C is a table chart showing conditions of programming, reading, and erasing voltages in FIG. 5A.

FIG. 5B shows voltage applied to the lines in the deselected cell string 20-1. The feature of FIG. 5B is different from that of FIG. 4A in that the dummy wordline DWL is supplied with the power source voltage VCC in FIG. 5B while the dummy wordline DWL of FIG. 4B is supplied with the program inhibit voltage Vpass or Vpass2. When the power source voltage VCC is applied to the dummy wordline DWL, the dummy transistor DTR operates simply as a pass transistor.

FIG. 5C shows voltages applied to the lines in the programming, reading, and erase operations for the NAND-type flash memory device in FIG. 5A.

Referring to FIG. 5C, the dummy wordline DWL is supplied with the power source voltage VCC in the reading and program operations. The dummy wordline DWL is conditioned in a floating state.

Hereinafter, the mechanism of preventing the program disturbance at the memory cells MC0 by the dummy memory cells DMC in the deselected cell string 20-1 shown in FIG. 5C will be described.

As in the case shown in FIG. 4D, a leakage current occurs by generation of electron-hole pairs (EHP) at the boundary surface between a gate oxide film and a silicon substrate Si-Sub in the source selection transistor SST. The electrons move toward the memory cell MC0 along the surface of the silicon substrate Si-Sub, passing through the dummy transistor DTR. The dummy transistor DTR functions to transfer the electrons. During this, the dummy transistor DTR disposed between the source selection transistor SST and the memory cell MC0 contributes to lengthen migration ranges of the electrons toward the memory cell MC0. Thus, while the electrons are being transferred toward the memory cell MC0, the energy of the electrons becomes weaker reducing the likelihood of these electrons becoming hot electrons. The electrons with the weaker energy cannot flow into the floating gate FG of the memory cell MC0 although they are scattering around the memory cell MC0, because the electrons do not have enough energy to move lengthwise. As a result, there is no program disturbance at the memory cell MC0.

Figure 6A:
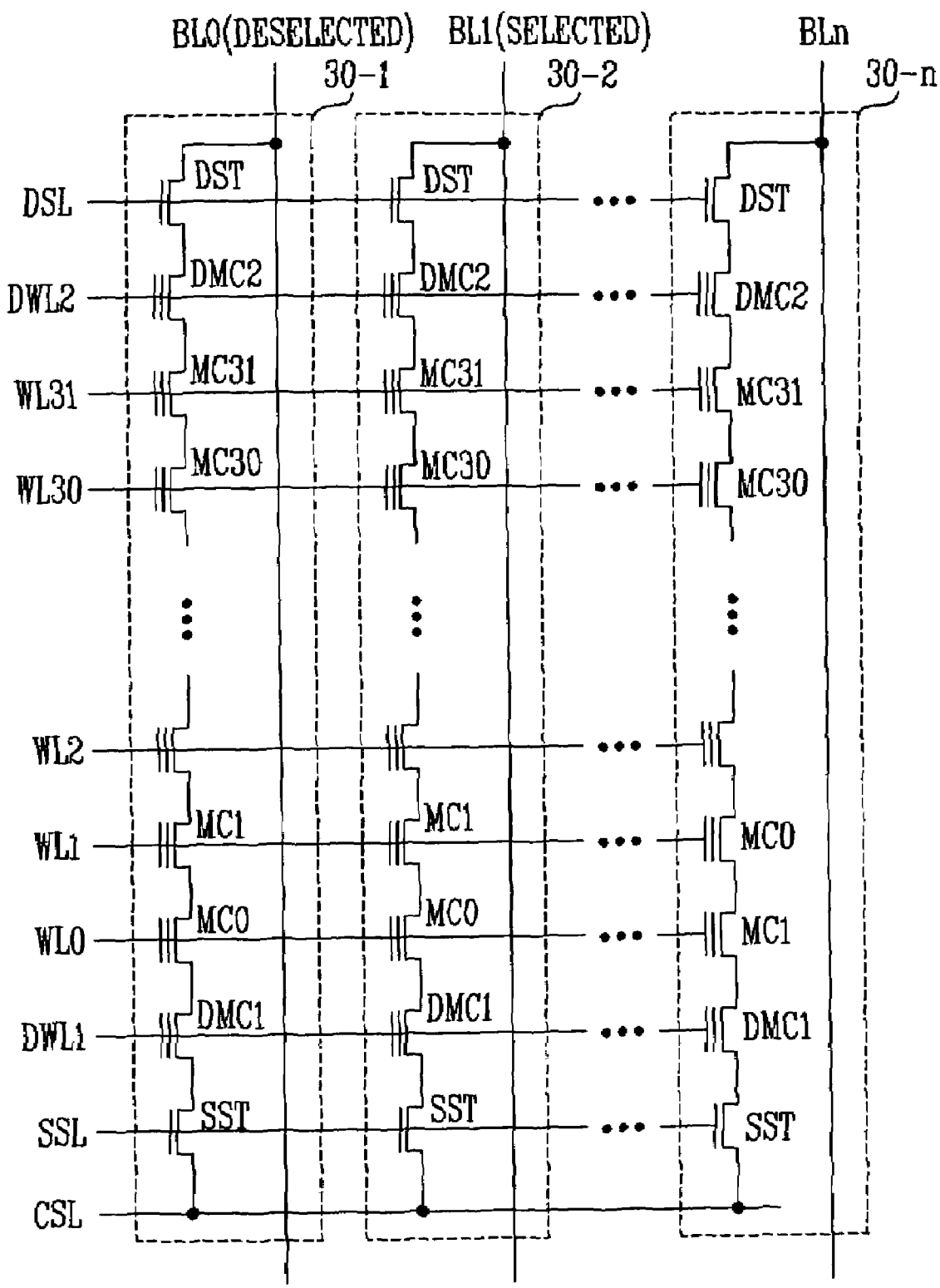
FIG. 6A is a diagram illustrating a NAND-type flash memory device in accordance with still another embodiment of the present invention.

FIG. 6A illustrates a NAND-type flash memory device in accordance with another embodiment of the present invention, being configured to prevent the program disturbance at memory cells coupled to the first and last wordlines.

In FIG. 6A, for the purpose of preventing the program disturbance at the memory cells MC0 and MC31, a first groupo of dummy memory cells DMC 1 are interposed between the source selection transistors SST and the memory cells MC0 and a second group of dummy memory cells DMC2 are interposed between the drain selection transistors DST and the memory cells MC31. Here, while the total number of the memory cells MC0~MC31 and the dummy memory cells DMC 1 and DMC2 in one bitline is 34, it should be appreciated that the total cell number may vary.

Figure 6B:
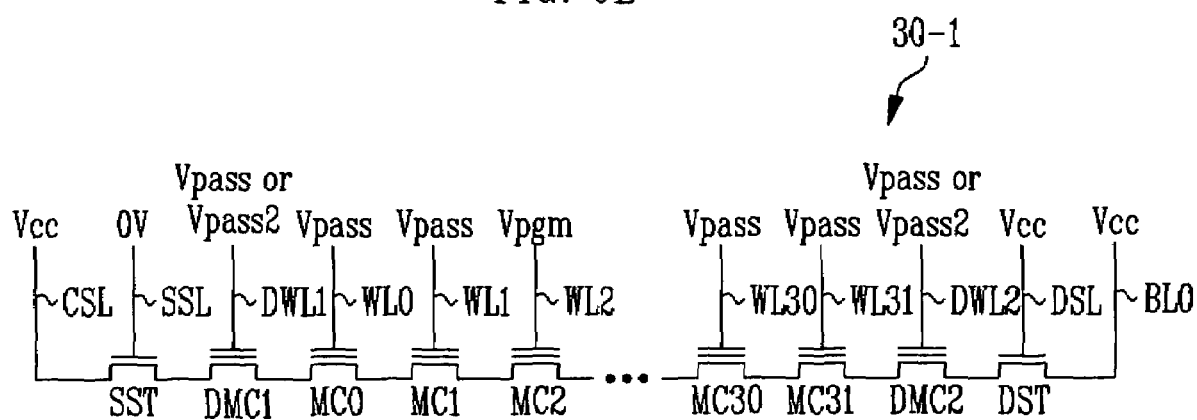
FIG. 6B is a diagram illustrating a structure of a deselected cell string shown in FIG. 6A.

FIG. 6B illustrates voltages applied to the lines of the deselected cell string 30-1 shown in FIG. 6A during the program operation. The feature of FIG. 6B is different from that of FIG. 4B in that a second dummy memory cell DMC2 is interposed between the drain selection transistor DST and the memory cell MC31.

The voltages applied to the lines during the programming, reading, and erase operations in the NAND-type flash memory device shown in FIG. 6A are the same as the voltage conditions shown in FIG. 4C.

As stated above, the memory cells MC0 and MC31 of the deselected cell string 30-1 shown FIG. 6B are not involved in the program disturbance by the effect with the dummy memory cells DMC1 and DMC2, as illustrated in FIG. 4D. The mechanism of generating the program disturbance at the memory cells MC0 and MC31 may be easily understood with reference to FIG. 4D which was previously described, so further description will be omitted.

Figure 7A:
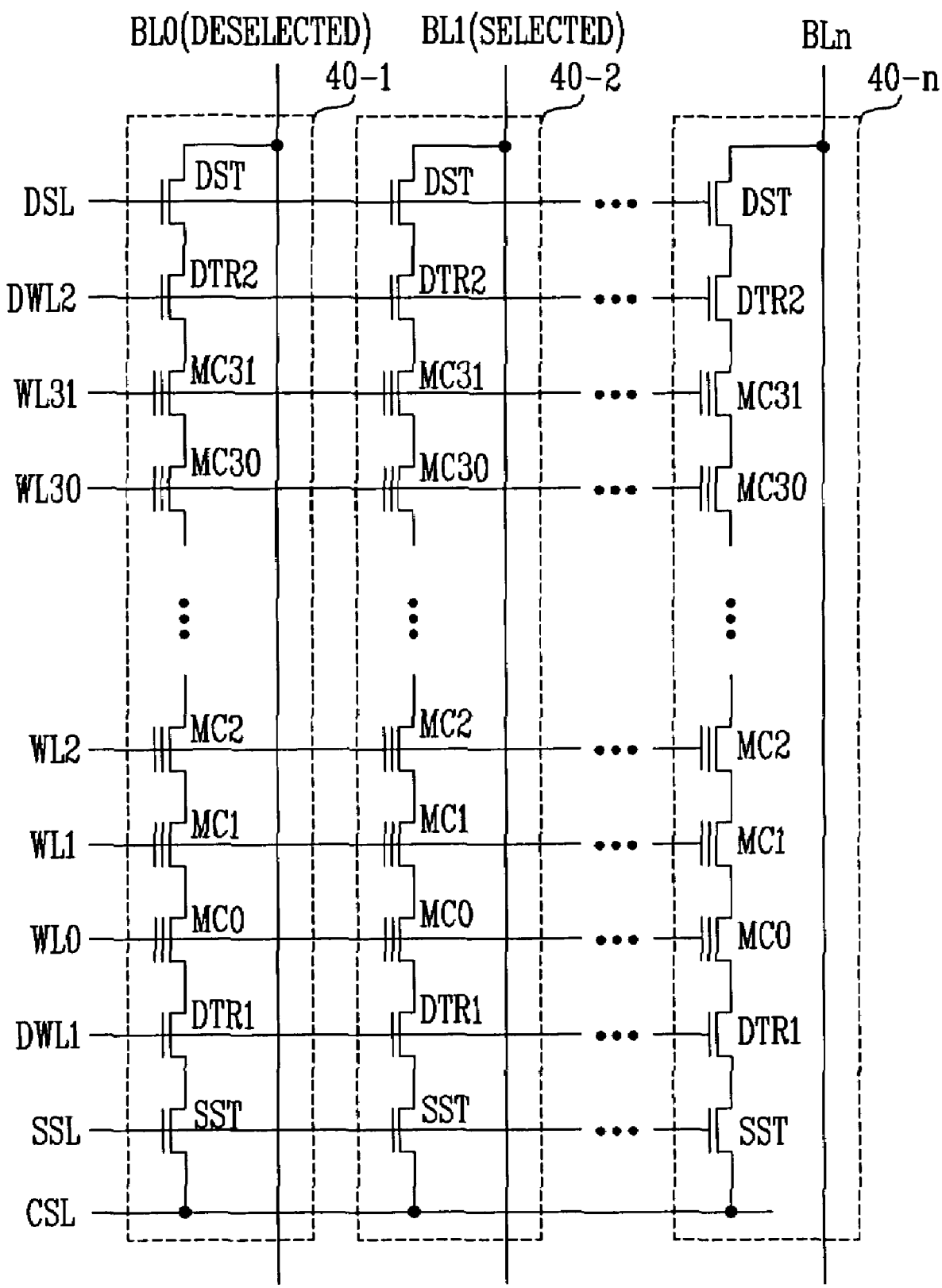
FIG. 7A is a diagram illustrating a NAND-type flash memory device in accordance with another embodiment of the present invention.

FIG. 7A illustrates a NAND-type flash memory device in accordance with another embodiment of the present invention, being configured to prevent the program disturbance at memory cells coupled to the first and last wordlines.

In FIG. 7A, for the purpose of preventing the program disturbance at the memory cells MC0 and MC31, dummy transistors DTR1 are interposed between the source selection transistors SST and the memory cells MC0 and dummy transistors DTR2 are interposed between the drain selection transistors DST and the memory cells MC31.

Figure 7B:
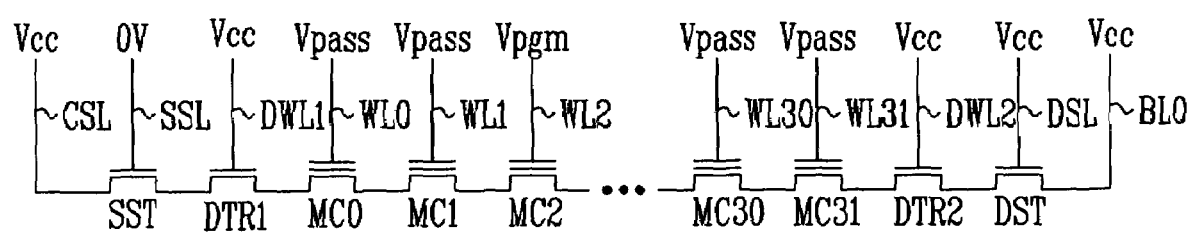
FIG. 7B is a diagram illustrating a structure of a deselected cell string shown in FIG. 7A.

FIG. 7B illustrates voltages applied to the lines of the deselected cell string 40-1 shown in FIG. 7A during the program operation. The feature of FIG. 7B is different from that of FIG. 5B in the fact that a dummy transistor DTR2 is further interposed between the drain selection transistor DST and the memory cell MC31.

The voltages applied to the lines during the programming, reading, and erase operations in the NAND-type flash memory device shown in 7A are the same as the voltage conditions shown in FIG. 5C.

As stated above, the memory cells MC0 and MC31 of the deselected cell string 40-1 shown FIG. 7B are not involved in the program disturbance by the effect with the dummy transistors DTR1 and DTR2 which act as like pass transistors, as illustrated through the embodiment shown in FIG. 5C. The mechanism of generating the program disturbance at the memory cells MC0 and MC31 may be easily understood with reference to the embodiment shown in FIG. 5C, so further description will be omitted.

Hereinafter, an embodiment for improving a programming speed of a memory cell coupled to the first or last wordline, for improving programming speeds of memory cells coupled to the first and last memory cells will be described.

Figure 8A:
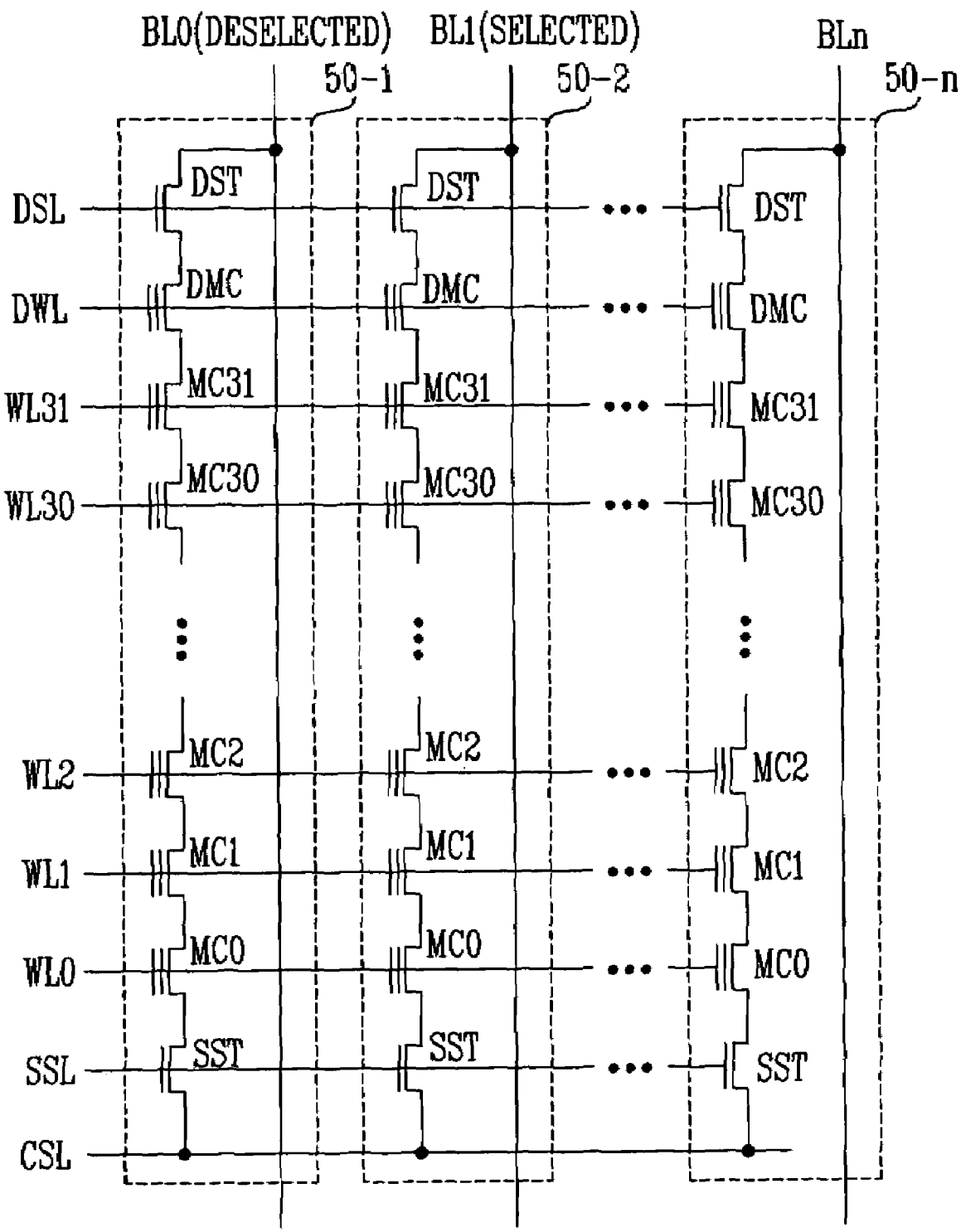
FIG. 8A is a diagram illustrating a NAND-type flash memory device in accordance with still another embodiment of the present invention.

FIG. 8A illustrates a NAND-type flash memory device in accordance with another embodiment of the present invention, being configured to improve a programming speed for a memory cell coupled to the last wordline.

In FIG. 8A, dummy memory cells DMC are interposed between the drain selection transistors DST and the memory cells MC31. The dummy memory cell DMC is provided to prevent the memory cells MC31 coupled to the last wordline WL31 to be programmed with lower speeds than that of the other memory cells MC0~MC30.

Figures 8B, 8C:
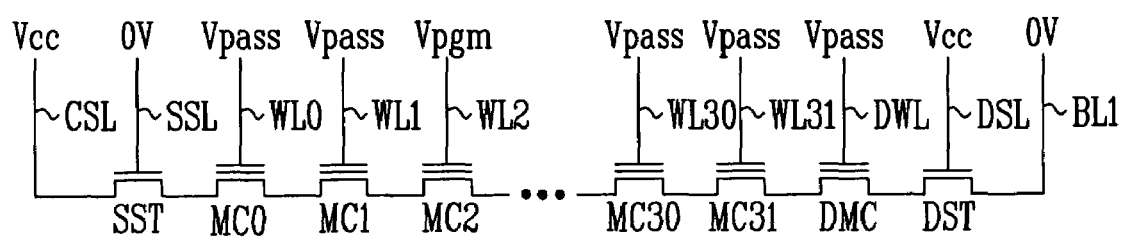
FIG. 8B is a diagram illustrating a structure of a selected cell string shown in FIG. 8A.
FIG. 8C is a table chart showing conditions of programming, reading, and erasing voltages in FIG. 8A.

FIG. 8B illustrates voltages applied to the lines of the selected cell string 50-2 shown in FIG. 8A during the program operation.

As shown in FIG. 8B, the program pass voltage Vpass is applied to the dummy wordline DWL during the program operation. Thus, a coupling ratio of the memory cell MC31 is maintained at a constant level which is the same as those of the other memory cells MC0~MC31. In other words, as the dummy memory cell DMC is disposed at the side of the memory cell MC31, the memory cell MC31 is not influenced by the potential of the drain selection transistor DST. Therefore, the memory cell MC31 is conditioned to act the same as the other memory cells MC0~MC30. As a result, a threshold voltage Vt of the memory cell MC31 is raised to be the same as those of the other memory cells MC0~MC31, making the memory cell MC31 identical to the other memory cells MC0~MC30 in programming speed.

FIG. 8C shows conditions of voltages applied to the lines during the programming, reading, and erase operations.

Referring to FIG. 8C, the dummy wordline DWL is supplied with the program inhibit voltage Vpass in the program operation, and with the read voltage Vread in the read operation. The dummy wordline DWL is supplied with the ground voltage 0V in the erase operation.

As shown in the table chart of the FIG. 8C, when the dummy wordline DWL and the other wordlines are supplied with a program erase voltage 0V, the memory cell MC31 is not be influenced by the potential of the drain selection transistor DST. Therefore, the memory cell MC31 is conditioned to act the same as the other memory cells MC0~MC30. As a result, the memory cell MC31 is identical to the other memory cells MC0~MC30 in programming speed.

Figure 9A:
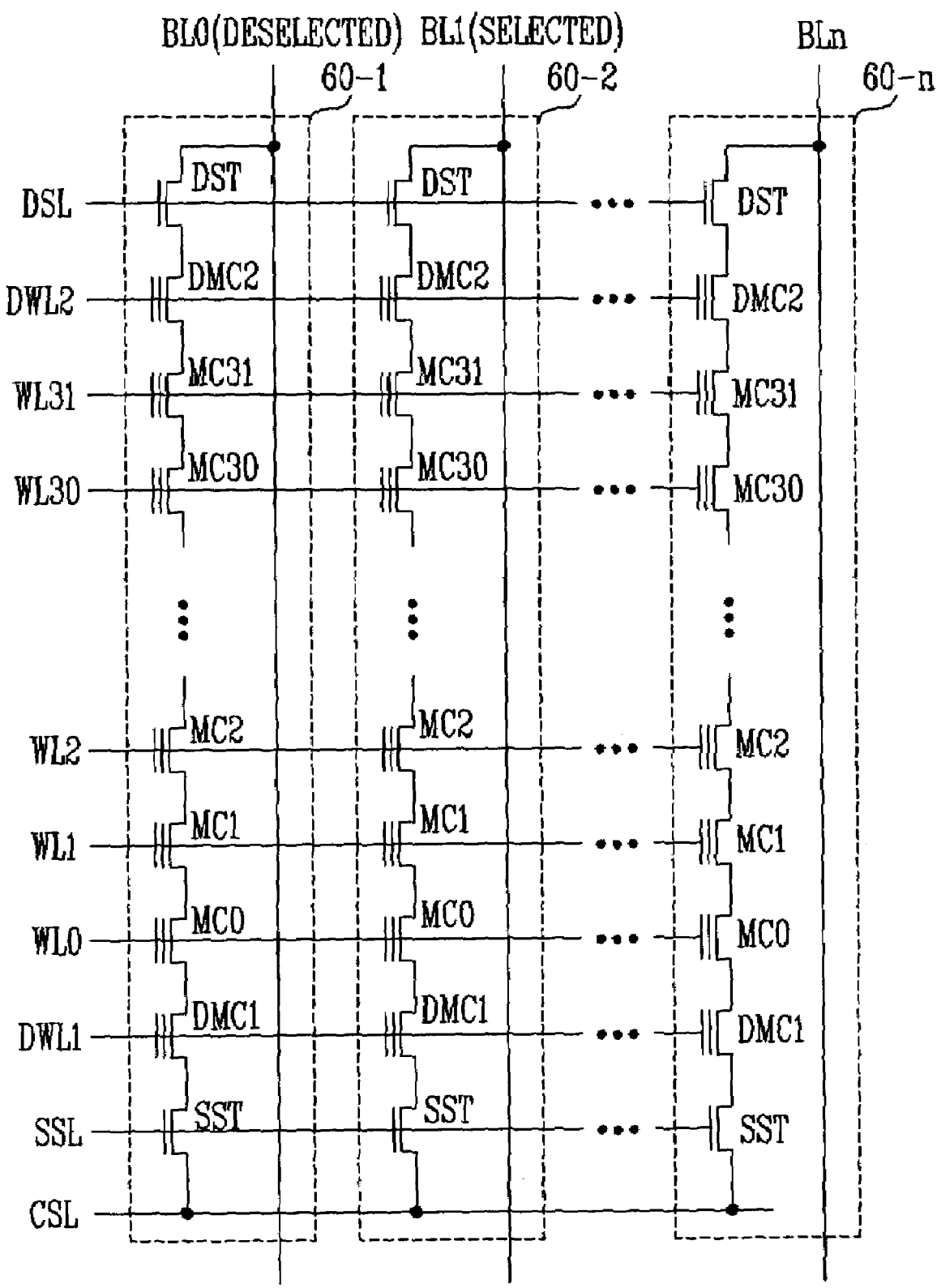
FIG. 9A is a diagram illustrating a NAND-type flash memory device in accordance with another embodiment of the present invention.

FIG. 9A illustrates a NAND-type flash memory device in accordance with another embodiment of the present invention, being configured to improve programming speeds for memory cells coupled to the first and last wordlines.

In FIG. 9A, dummy memory cells DMC2 are interposed between the drain selection transistors DST and the memory cells MC31 and dummy memory cells DMC1 are interposed between the source selection transistors SST and the memory cells MC31. The dummy memory cell DMC is provided to prevent programming speeds from being reduced to lower than that of the other memory cells MC0~MC30.

Figure 9B:
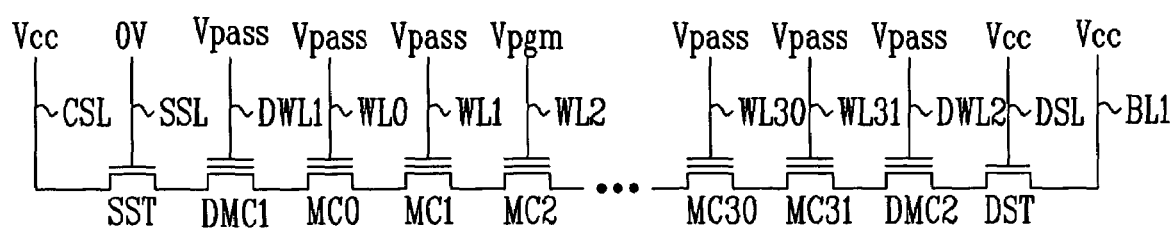
FIG. 9B is a diagram illustrating a structure of a selected cell string shown in FIG. 9A.

FIG. 9B illustrates voltages applied to the lines of the selected cell string 60-2 shown in FIG. 9A during the program operation.

As shown in FIG. 9B, the program pass voltage Vpass is applied to the dummy wordlines DWL1 and DWL2 during the program operation. Thus, a coupling ratio of the memory cell MC31 is maintained at a constant level which is the same as those of the other memory cells MC0~MC31. In other words, as the dummy memory cells DMC1 and DMC2 are disposed at the sides of the memory cells MC0 and MC31, the memory cells MC0 and MC31 are not influenced by the potentials of the source selection transistor SST and the drain selection transistor DST. Therefore, the memory cells MC0 and MC31 are conditioned to act the same as the other memory cells MC1~MC30. As a result, threshold voltages Vt of the memory cells MC0 and MC31 are raised to be same as those of the other memory cells MC1~MC31, making the memory cells MC0 and MC31 identical to the other memory cells MC1~MC30 in programming speed.

The voltage conditions for the lines during the programming, reading, and erase operations in the NAND-type flash memory device shown in FIG. 9A are the same as those shown FIG. 8C.

In FIG. 9A, when the program erase voltage 0V is applied to the dummy wordlines DWL1 and DWL2 during the erase operation, the memory cells MC0 and MC31 are not influenced by the potentials of the source selection transistor SST and the drain selection transistor DST. Therefore, the memory cells MC0 and MC31 are conditioned to act the same as the other memory cells MC1~MC30. As a result, the memory cells MC0 and MC31 have the same erasing speeds as the other memory cells MC1~MC30.

Figure 10A:
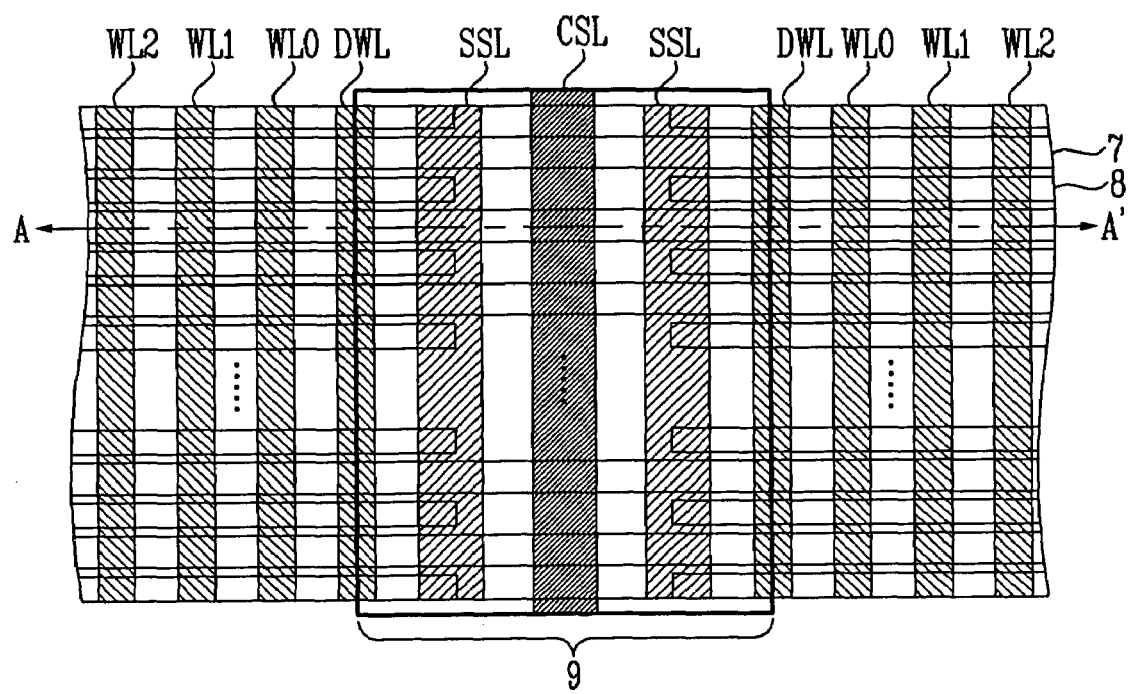
FIG. 10A is a layout diagram of a cell string of a NAND-type flash memory device including dummy memory cells.
Figure 10B:
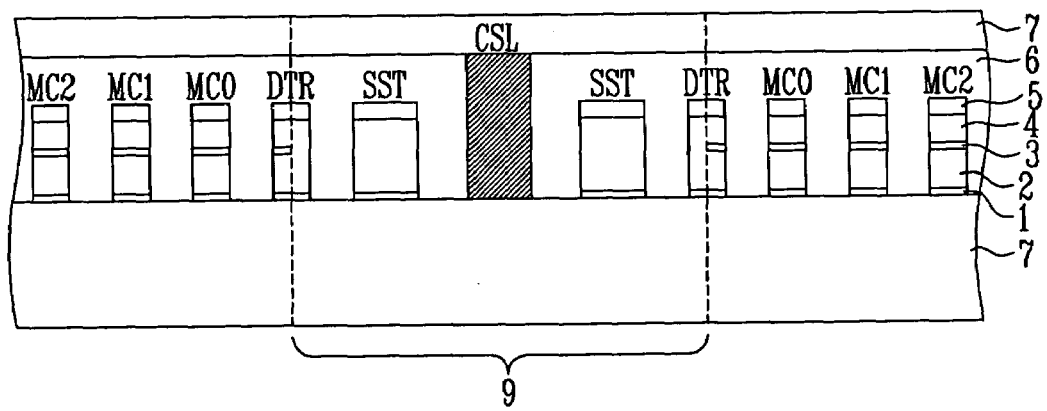
FIG. 10B is a sectional diagram by A-A' of FIG. 10A.

FIG. 10A illustrates a cell string of a NAND-type flash memory device, in which a dummy transistor is interposed between the source selection transistor coupled to the source selection line and a memory cell coupled to the first wordline, through a dummy wordline. FIG. 10B illustrates a section taken along with the line A-A' of FIG. 10A.

In FIGS. 10A and 10B, the reference numbers 1, 2, 3, 4, 5, 6, 7, 8, and 9 respectively denote: a tunnel oxide film 1, a floating gate 2 (polycrystalline silicon film), an insulation film 3, a control gate 4 (polycrystalline silicon film), a metal or metal silicide film 5, an interlevel insulation film 6, an active region 7, a floating gate 8, and a floating-gate removed region 9 in an insulation-film removed region between the floating gate and the control gate.

First, an isolation process is carried out to form the active region. After depositing a polycrystalline silicon (hereinafter, polysilicon) film to be used for the tunnel oxide film 1 and the floating gate 2, the polysilicon film is selectively removed by means of a photolithography and etching process. Next, after depositing the insulation film 3 to isolate a space between the floating gate 2 and the control gate 4, the insulation film 3 of the dummy transistor DTR is partially or entirely removed, as well as the insulation film 3 of the source selection transistor SST (the portions denoted by the reference number 9 in FIGS. 10A and 10B). While herein is illustrated such that the insulation film of the dummy transistor DTR is partially removed, the insulation film of the dummy transistor DTR may also be removed entirely. After removing the insulation film 3, a polysilicon film, a metal silicide film or metal film 5 is deposited for the control gate 4. After completing the deposition processes, a lithographic and etching process is resumed to complete the overall gate formation process. After completing the gate formation process, the interlevel insulation film 6 is deposited and a contact for the common source line CSL is formed therein. After forming the gates, the subsequent metal interconnection process is carried out.

Figure 11A:
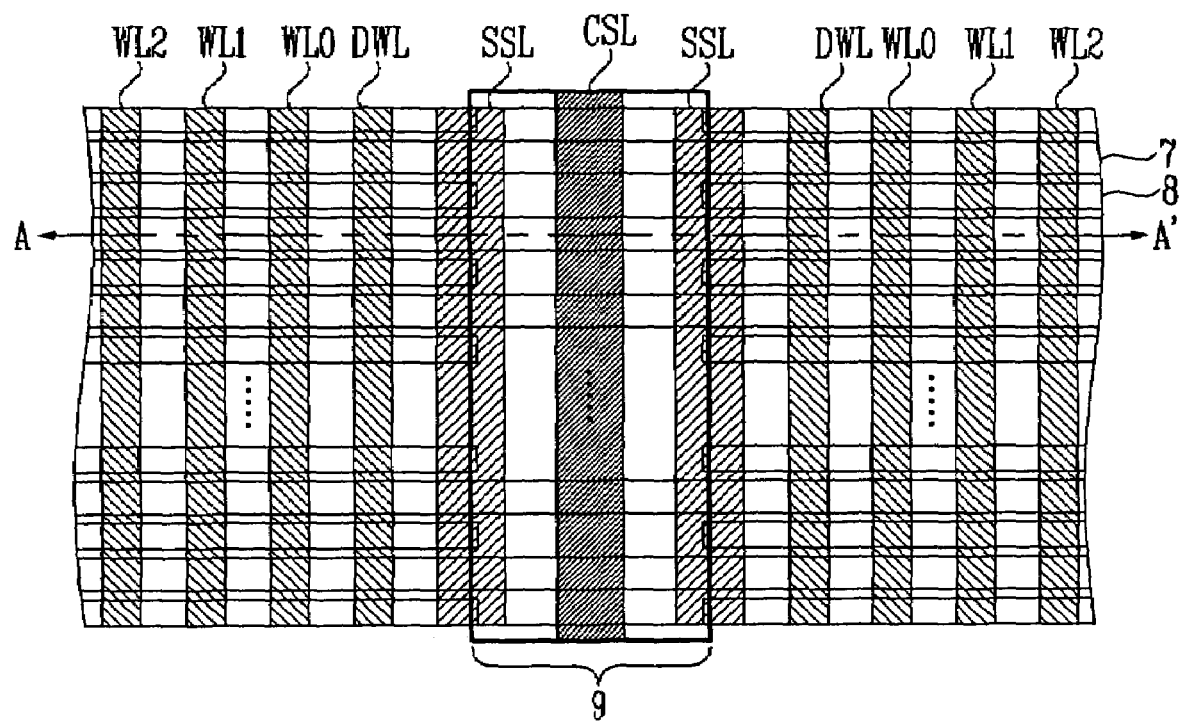
FIG. 11A is a layout diagram of a cell string of a NAND-type flash memory device including dummy memory cells.
Figure 11B:
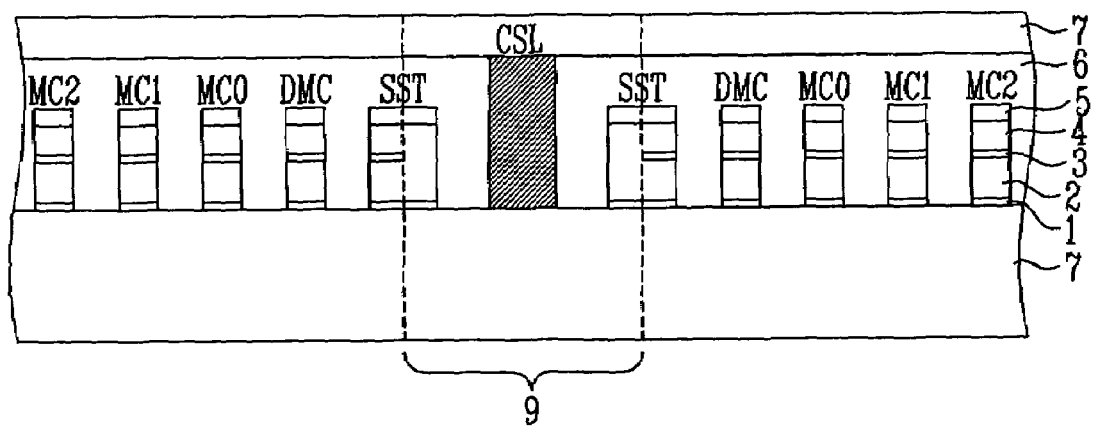
FIG. 11B is a sectional diagram by A-A' of FIG. 11A.

FIG. 11A illustrates a cell string of a NAND-type flash memory device, in which a dummy memory cell is interposed between the source selection transistor coupled to the source selection line and a memory cell coupled to the first F wordline, through a dummy wordline. FIG. 11B illustrates a section taken along with the line A-A' of FIG. 11A.

In FIGS. 11A and 11B, the portion where the insulation film 3 is removed includes the source selection transistor SST in a process removing the insulation film 3 that isolates the floating gate 2 from the control gate 4 (the portion denoted by the reference number 9 in FIGS. 10 and 11). The dummy memory cell DMC added thereto is formed in the same process and structure with the memory cells MC0~MC31.

In one embodiment, the dummy memory cells DMC, DMC0, and DMC1, and the dummy transistors, DTR, DTR1, and DTR2, have the same size as the memory cells MC0~MC31. In alternative embodiments, the dummy memory cells DMC, DMC0, and DMC1, and the dummy transistors DTR, DTR1, and DTR2 have sizes that vary within 30% of the sizes of the memory cells MC0~MC31.

As aforementioned, the present invention utilizes the dummy memory cells or the dummy transistors for set the memory cells coupled to the first and last wordlines in the same environment with the other memory cells coupled to the other wordlines. The dummy memory cells and transistors are formed by the same processing methods as the memory cells MC0~MC31.

Furthermore, the present invention employs multi-level cells associated with narrow distribution gaps of threshold voltage profiles and an increased number of memory cells in a cell string.

According to the present invention, as the memory cells coupled to the first and last wordlines are operable in the same features with the other memory cells, the present invention prevents the program disturbance at the memory cells coupled to the first and last wordlines in the deselected cell string. Moreover, the present invention can enhance programming/erasing speeds for the memory cells coupled to the first and last wordlines in the selected cell string.

Although the present invention has been described in connection with the embodiment of the present invention illustrated in the accompanying drawings, it is not limited thereto. It will be apparent to those ordinary skilled in the art that various substitutions, modifications, and changes may be thereto without departing from the scope and spirit of the invention.

What is claimed is:

1. A flash memory device comprising:
a first selection transistor coupled to a bitline;
a second selection transistor coupled to a common source line;
a plurality of memory cells coupled between the first and second selection transistors, each memory cell being coupled to a wordline, and
a single dummy memory cell provided between the first selection transistor and one of the memory cells which is adjacent to the first selection transistor or between the second selection transistor and one of the memory cells which is adjacent to the second selection transistor,
wherein the dummy memory cell is supplied with a program inhibit voltage applied to the dummy memory cell during a program operation.

2. The flash memory device of claim 1, wherein the memory cell which is adjacent to the first selection transistor and a deselected bitline of the bitlines are substantially free from an effect of program disturbance.

3. The flash memory as set forth in claim 1, wherein the dummy memory cell is supplied with a voltage that is more than twice a power source voltage and less than a program inhibit voltage during a program operation.

4. The flash memory as set forth in claim 1, wherein the dummy memory cell is supplied with a ground voltage during an erase operation and supplied with a read voltage applied to the dummy memory cell during a read operation.

5. The flash memory as set forth in claim 1, wherein the dummy memory cell has the same size as the plurality of memory cells coupled between the first and second selection transistors.

6. The flash memory as set forth in claim 1, wherein each of the memory cells is configured to store at least two bits of data, the dummy memory cell not being configured to store at least two bits of data.

7. A flash memory device comprising:
a first selection transistor coupled to a bitline;
a second selection transistor coupled to a common source line;
a plurality of memory cells provided between the first and second selection transistors, each memory cell being coupled to a wordline; and
a single dummy transistor provided between the first selection transistor and one of the memory cells which is adjacent to the first selection transistor or between the second selection transistor and one of the memory cells which is adjacent to the second selection transistor, wherein a dummy transistor is conditioned in a floating state during an erase operation.

8. The flash memory as set forth in claim 7, wherein threshold voltages of memory cells adjacent to the first selection or the second selection transistor and a selected bitline of the plurality of bitlines are equal to threshold voltages of the other memory cells.

9. The flash memory as set forth in claim 7, wherein a dummy transistor is supplied with a power source voltage during program and read operations.

10. The flash memory as set forth in claim 7, wherein the memory cells including the dummy transistor have substantially the same size.

11. The flash memory as set forth in claim 7, wherein each of the memory cells except the dummy transistor is configured to store at least two bits of data.

12. A flash memory device comprising:
first selection transistors each coupled to a plurality of bitlines;
second selection transistors coupled to a common source line;
a plurality of memory cells coupled between the first and second selection transistors and coupled to a plurality of wordlines; and
first dummy transistors provided between the first selection transistors and one of the memory cells which is adjacent to the first selection transistors and second dummy transistors provided between the second selection transistors and one of the memory cells which is adjacent to the second selection transistors, wherein a dummy transistor is conditioned in a floating state during an erase operation.

13. The flash memory as set forth in claim 12, wherein memory cells coupled to the first and last wordlines, and a deselected bitline of the plurality of bitlines do not exhibit a significant program disturbance effect.

14. The flash memory as set forth in claim 12, wherein threshold voltages of memory cells coupled to the first and last wordlines and a selected bitline of the plurality of bitlines are equal to threshold voltages of the other memory cells coupled between the first and second selection transistors.

15. The flash memory as set forth in claim 12, wherein a first dummy wordline coupled to the first dummy transistors and a second dummy wordline coupled to the second dummy transistors are supplied with a power source voltage during program and read operations.

16. The flash memory as set forth in claim 12, wherein the first and second dummy transistors have the same size as the plurality of memory cells coupled between the first and second selection transistors.

17. The flash memory as set forth in claim 12, wherein the memory cells except the first and second dummy transistors are configured to store at least two bits of data.

18. A flash memory device comprising:
a first selection transistor coupled to a bitline;
a second selection transistor coupled to a common source line;
a plurality of memory cells coupled between the first and second selection transistors, each memory cell being coupled to a wordline, and
a first dummy memory cell provided between the first selection transistor and one of the memory cells which is adjacent to the first selection transistor and a second dummy memory cell provided between the second selection transistor and one of the memory cells which is adjacent to the second selection transistor,
wherein the first and second dummy memory cells are supplied with a program inhibit voltage during a program operation.

19. The flash memory as set forth in claim 18, wherein the memory cells which are adjacent to the first and second selection transistor and a deselected bitline of the bitlines are substantially free from an effect of program disturbance.

20. The flash memory as set forth in claim 18, wherein the first and second dummy memory cells are supplied with a voltage higher than twice a power source voltage and lower than the program inhibit voltage during a program operation.

21. The flash memory as set forth in claim 18, wherein the first and second dummy memory cells are supplied with a ground voltage during an erase operation and supplied with a read voltage during a read operation.

22. The flash memory as set forth in claim 18, wherein the first and second dummy memory cells have the same size as the plurality of memory cells coupled between the first and second selection transistors.

23. The flash memory as set forth in claim 18, wherein each of the memory cells is configured to store at least two bits of data, the first and second dummy memory cells not being configured to store at least two bits of data.

* * * * *